(12) United States Patent
Chang

(10) Patent No.: US 7,224,812 B2
(45) Date of Patent: May 29, 2007

(54) CONDENSER MICROPHONE AND METHOD FOR MAKING THE SAME

(75) Inventor: Chao-Chih Chang, Taichung (TW)

(73) Assignee: Taiwan Carol Electronics Co., Ltd., Taichung (TW)

( * ) Notice: Subject to any disclaimer, the term of this patent is extended or adjusted under 35 U.S.C. 154(b) by 512 days.

(21) Appl. No.: 10/755,987

(22) Filed: Jan. 13, 2004

(65) Prior Publication Data
US 2005/0152571 A1 Jul. 14, 2005

(51) Int. Cl.
*H04R 25/00* (2006.01)

(52) U.S. Cl. ...................................... 381/174; 381/181
(58) Field of Classification Search ................ 381/174, 381/175, 176, 191; 367/170, 181
See application file for complete search history.

(56) References Cited

U.S. PATENT DOCUMENTS 6,738,484 B2 * 5/2004 Nakabayashi ............... 381/174
6,741,709 B2 * 5/2004 Kay et al. ................... 381/175
7,062,052 B2 * 6/2006 Kajihara et al. ............ 381/174

* cited by examiner

*Primary Examiner*—Sinh Tran
*Assistant Examiner*—Brian Ensey
(74) *Attorney, Agent, or Firm*—Ladas & Parry LLP

(57) ABSTRACT

A condenser microphone includes a condenser housing defining an inner space therein, and a variable gap condenser enclosed in the condenser housing. The variable gap condenser includes an insulating substrate, a conductive fixed back plate mounted securely on the insulating substrate, a diaphragm unit movable relative to the back plate in a first transverse direction relative to the back plate, and a spacer unit interposed between and in contact with the back plate and the diaphragm unit so as to define a variable gap thereamong. The spacer unit defines at least an air passage that extends in a second transverse direction relative to the first transverse direction and that is in spatial communication with the inner space and the variable gap.

5 Claims, 10 Drawing Sheets

CONDENSER MICROPHONE AND METHOD FOR MAKING THE SAME

BACKGROUND OF THE INVENTION

1. Field of the Invention

This invention relates to a condenser microphone, more particular to a condenser microphone including a spacer unit that is formed with a plurality of air passages and to a method for making the same.

2. Description of the Related Art

FIG. 1 illustrates a conventional condenser microphone that is formed by micro-machining technology and that includes a variable gap condenser mounted in a condenser housing 300. The variable gap condenser includes a silicon substrate 30 mounted on a bottom wall of the condenser housing 300, an insulating substrate 31 formed on the silicon substrate 30 and formed with a buffering recess 311, a conductive back plate 32 formed on the insulating substrate 31 and defining a first electrode of the condenser microphone, a spacer 33 formed on the back plate 32, a compliant layer 34 formed on the spacer 33 and cooperating with the spacer 33 and the back plate 32 to define a variable gap 36 thereamong that is surrounded by the spacer 33, and a conductive film 35 formed on the compliant layer 34 and defining a second electrode of the condenser microphone. A field effect transistor 200 is formed on the insulating substrate 31, and is connected electrically to the conductive film 35 so that a change in capacitance of the variable gap condenser due to vibration of the compliant layer 34 by an incoming sound wave can be converted into a corresponding electrical signal.

A plurality of through-holes 321 are formed in the back plate 32 and a top wall of the insulating substrate 31 so as to permit spatial communication between the variable gap 36 and the buffering recess 311 in the insulating substrate 31 and so as to reduce air stream resistance in the variable gap 36 during microphone operation.

The conventional condenser microphone is disadvantageous in that formation of the buffering recess 311, which normally has a depth ranging from 300 to 500 microns, in the insulating substrate 31 involves bulk etching process, which is time-consuming. Moreover, formation of the aforesaid through-holes 321 further increases the production time.

SUMMARY OF THE INVENTION

Therefore, the object of the present invention is to provide a condenser microphone that is capable of overcoming the aforementioned drawbacks of the prior art.

Another object of the present invention is to provide a method for making the condenser microphone of this invention.

According to one aspect of the present invention, there is provided a condenser microphone that includes: a condenser housing defining an inner space therein; and a variable gap condenser enclosed in the inner space in the condenser housing. The variable gap condenser includes an insulating substrate, a conductive fixed back plate mounted securely on the insulating substrate, a diaphragm unit spaced apart from the back plate and aligned with and movable relative to the back plate in a first transverse direction relative to the back plate, and a spacer unit interposed between and in contact with the back plate and the diaphragm unit so as to support the diaphragm unit on the back plate and so as to define a variable gap thereamong. The spacer unit defines at least an air passage that extends in a second transverse direction relative to the first transverse direction and that is disposed between and that is in spatial communication with the inner space and the variable gap.

According to another aspect of the present invention, there is provided a method for making the condenser microphone. The method includes the steps of: (a) preparing an insulating substrate; (b) forming a conductive back plate on the insulating substrate; (c) forming a spacer unit and a sacrificial layer on the back plate in such a manner that the spacer unit is divided by the sacrificial layer into a plurality of spacer blocks; (d) forming a compliant layer on the spacer unit and the sacrificial layer; (e) forming a conductive film on the compliant layer, the conductive film and the compliant layer cooperatively defining a diaphragm unit that is movable relative to the back plate; (f) removing the sacrificial layer from the back plate so as to form a plurality of air passages, each of which is defined by two adjacent ones of the spacer blocks, and so as to form a variable gap disposed between the compliant layer and the back plate and surrounded by the spacer blocks; and (g) mounting the assembly of the insulating substrate, the back plate, the spacer unit, and the diaphragm unit in a condenser housing in such a manner that the air passages are in spatial communication with an inner space defined by the condenser housing.

BRIEF DESCRIPTION OF THE DRAWINGS

In the drawings which illustrate embodiments of the invention.

DETAILED DESCRIPTION OF THE PREFERRED EMBODIMENTS

Figure 1:
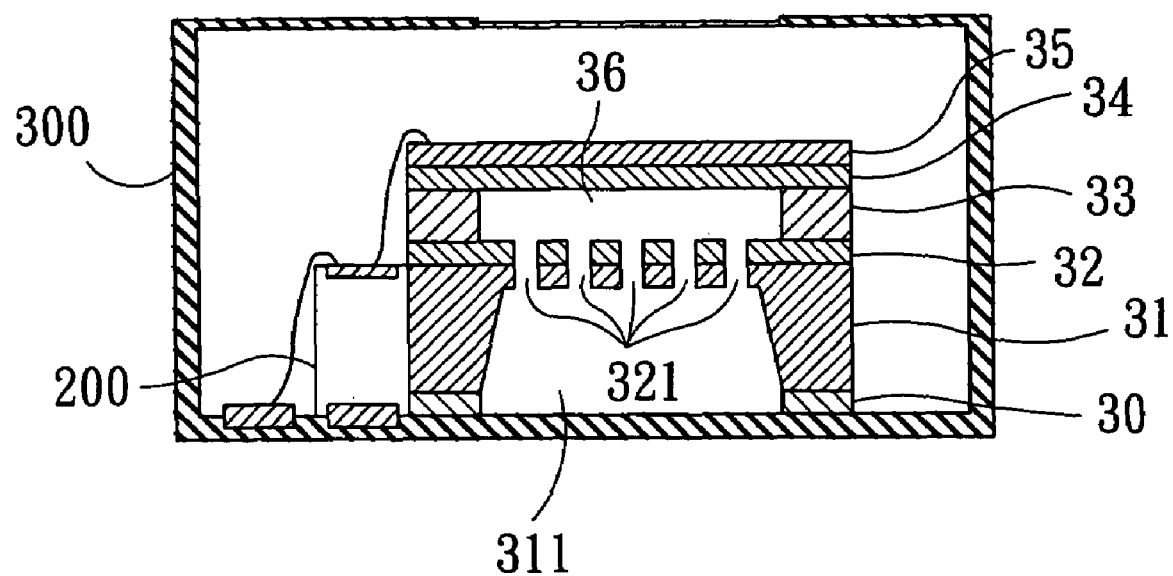
FIG. 1 is a schematic sectional view of a conventional condenser microphone.
Figure 2:
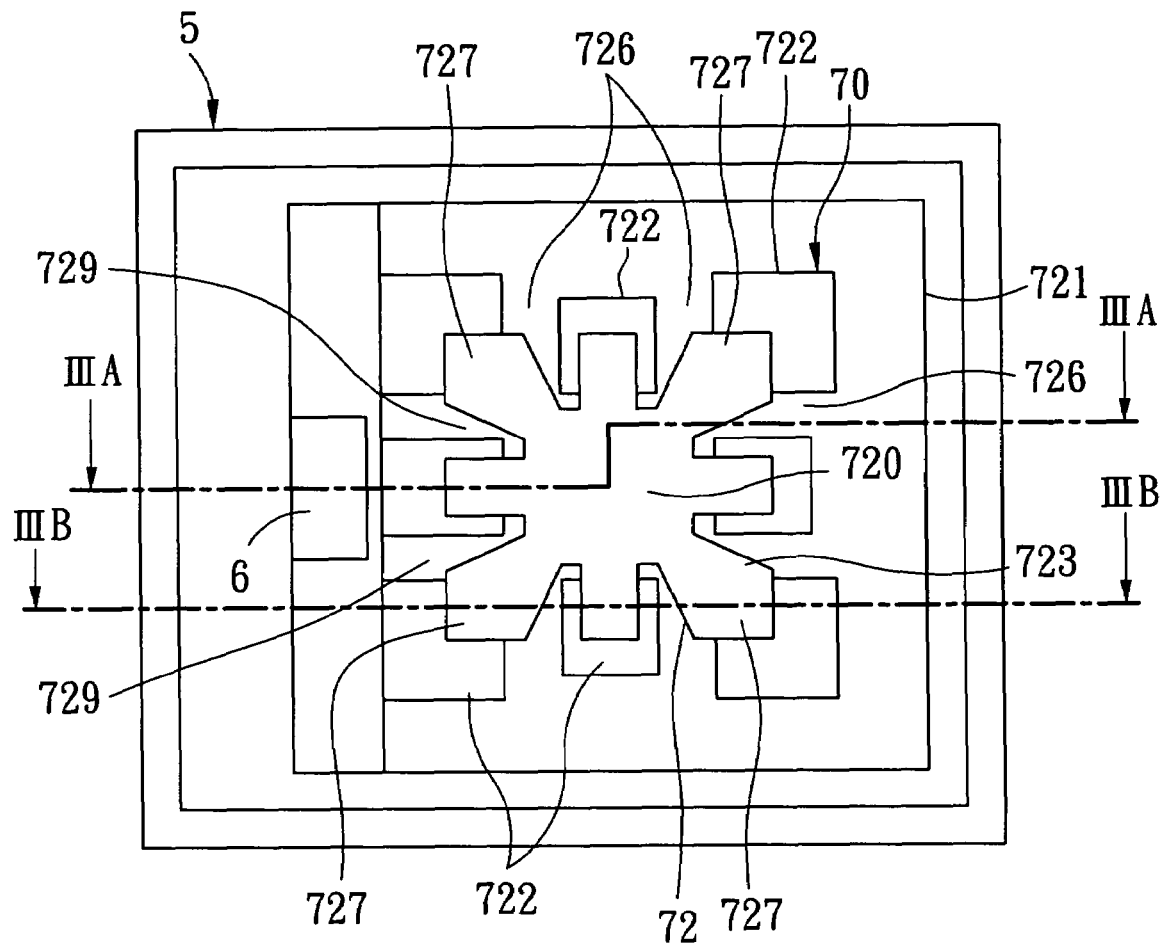
FIG. 2 is a schematic top view of the first preferred embodiment of a condenser microphone according to this invention.
Figure 3A:
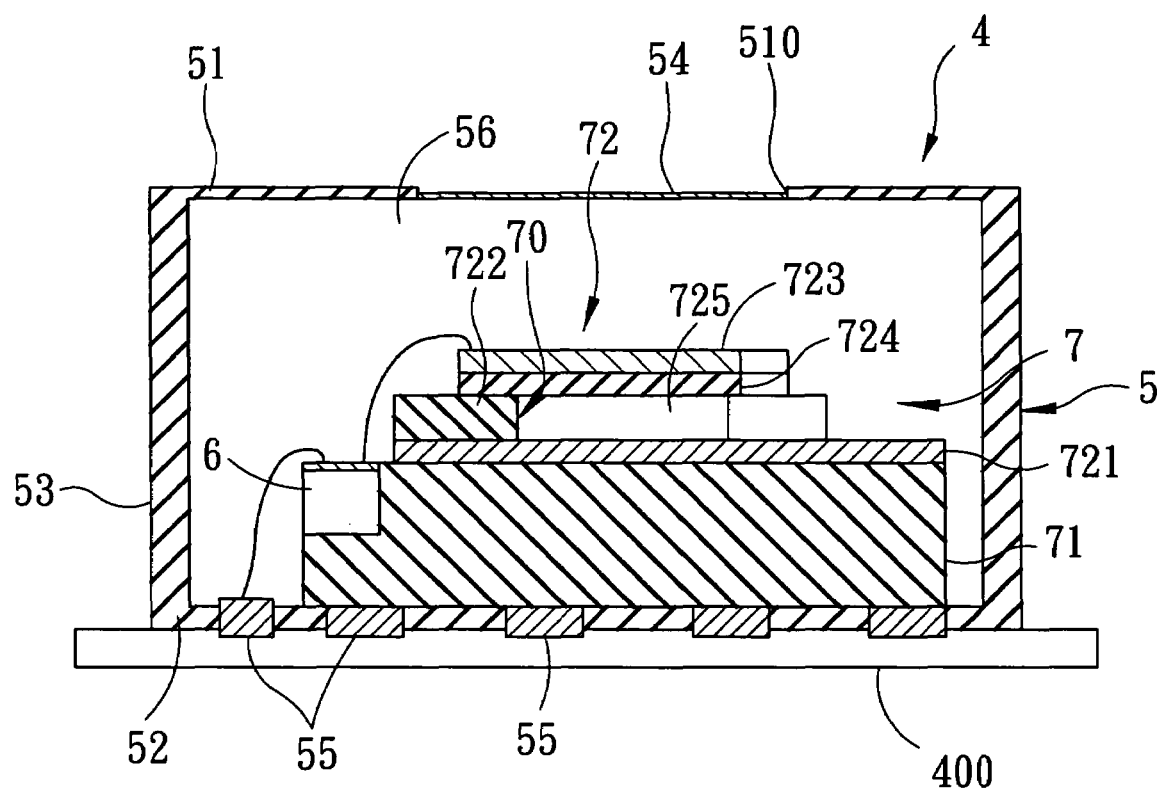
FIG. 3A is a schematic sectional view of the first embodiment taken along lines IIIA—IIIA in FIG. 2.
Figure 3B:
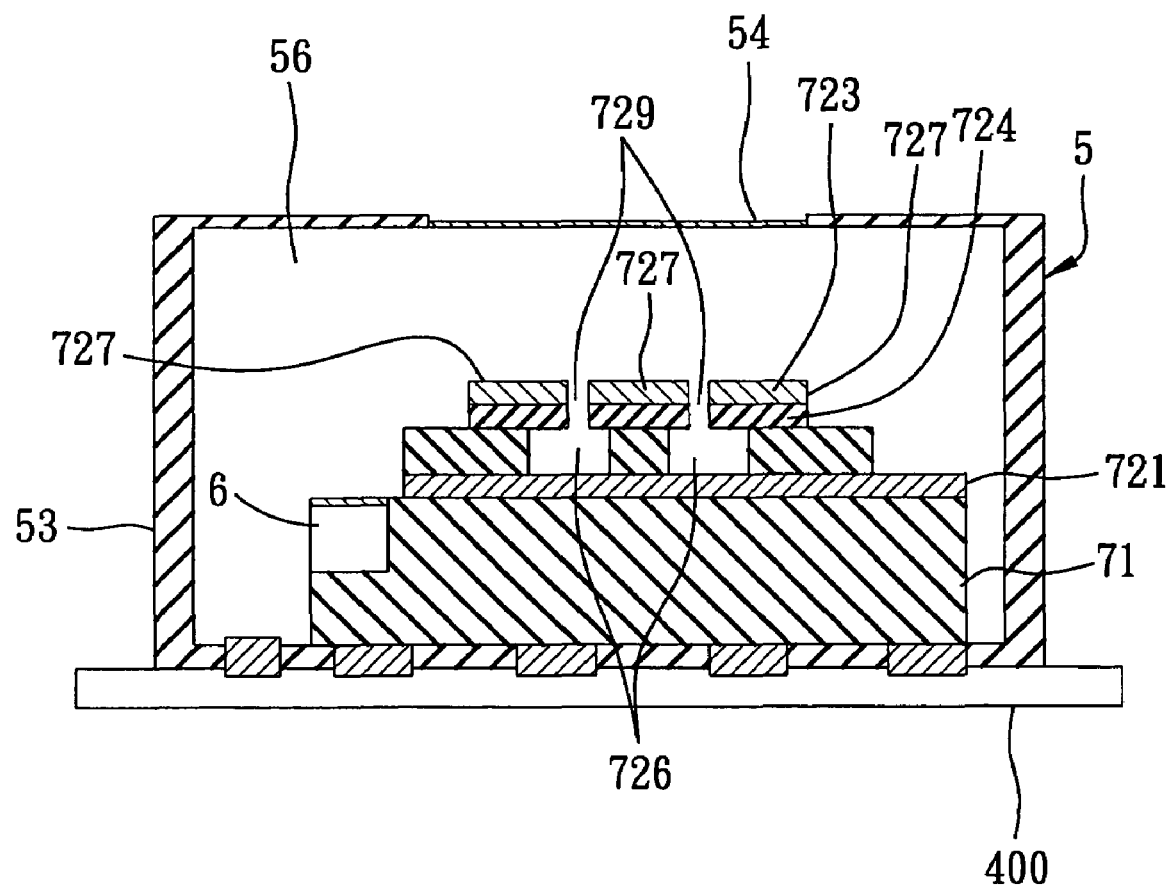
FIG. 3B is a schematic sectional view of the first embodiment taken along lines IIIB—IIIB in FIG. 2.
Figure 4:
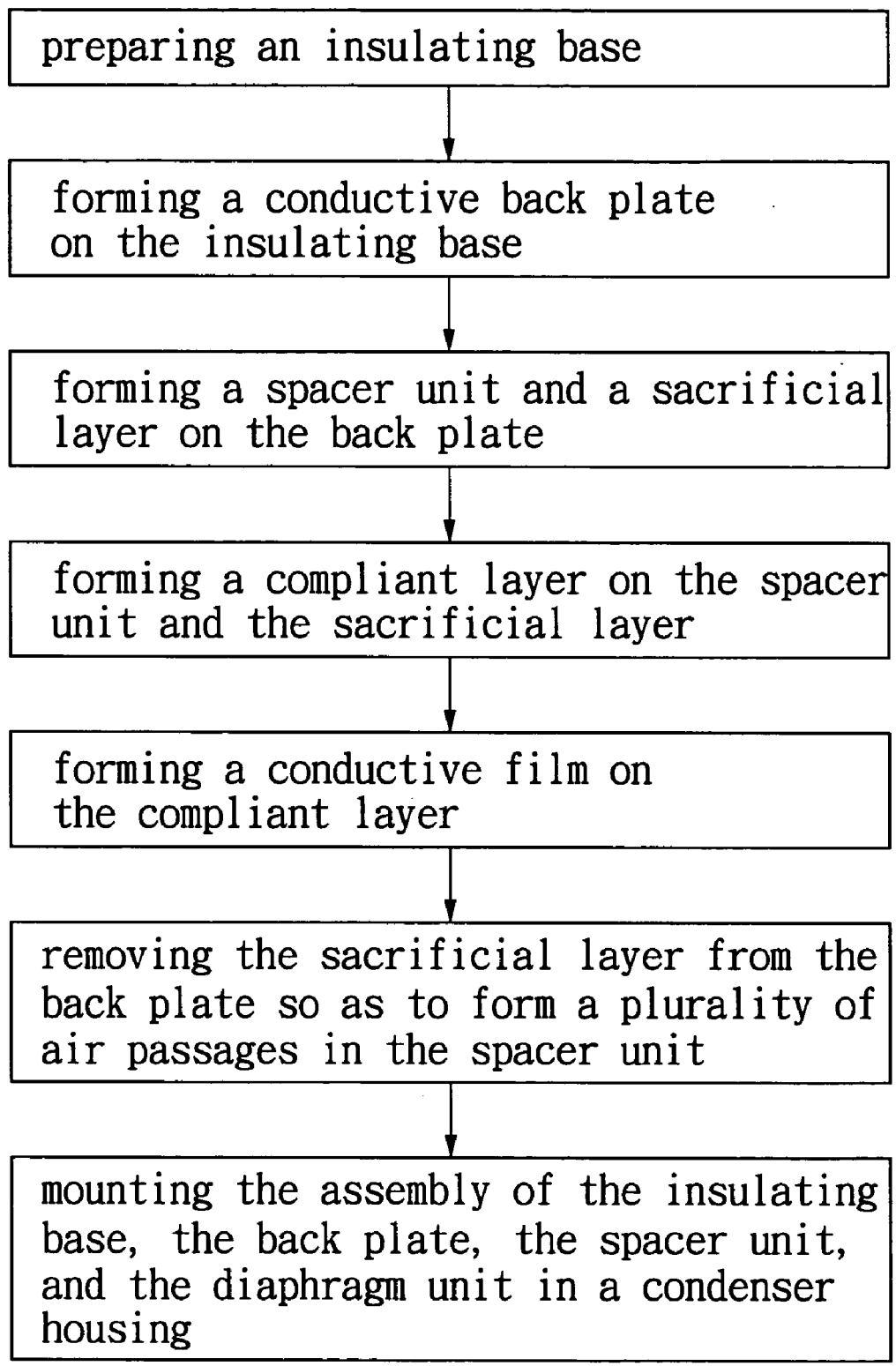
FIG. 4 is a block diagram illustrating consecutive steps of a method for making the first embodiment.
Figure 5:
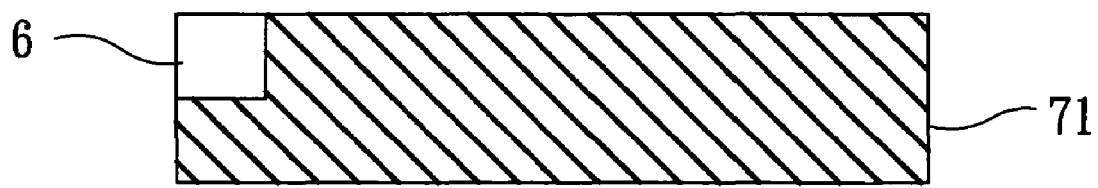
FIG. 5 is a schematic view to illustrate how a field effect transistor is formed on an insulating substrate of the first embodiment according to the method of this invention.
Figure 6:
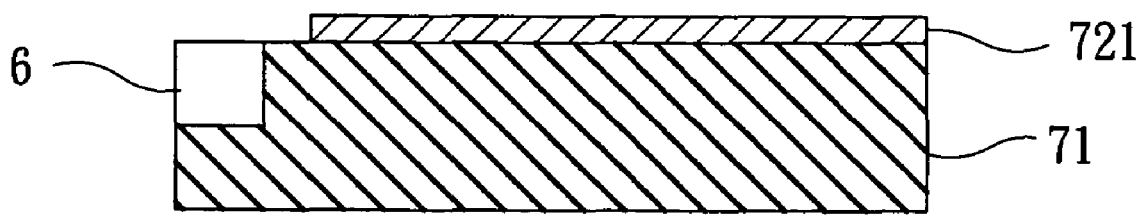
FIG. 6 is a schematic view to illustrate how a conductive back plate is formed on the insulating substrate of the first embodiment according to the method of this invention.
Figure 7:
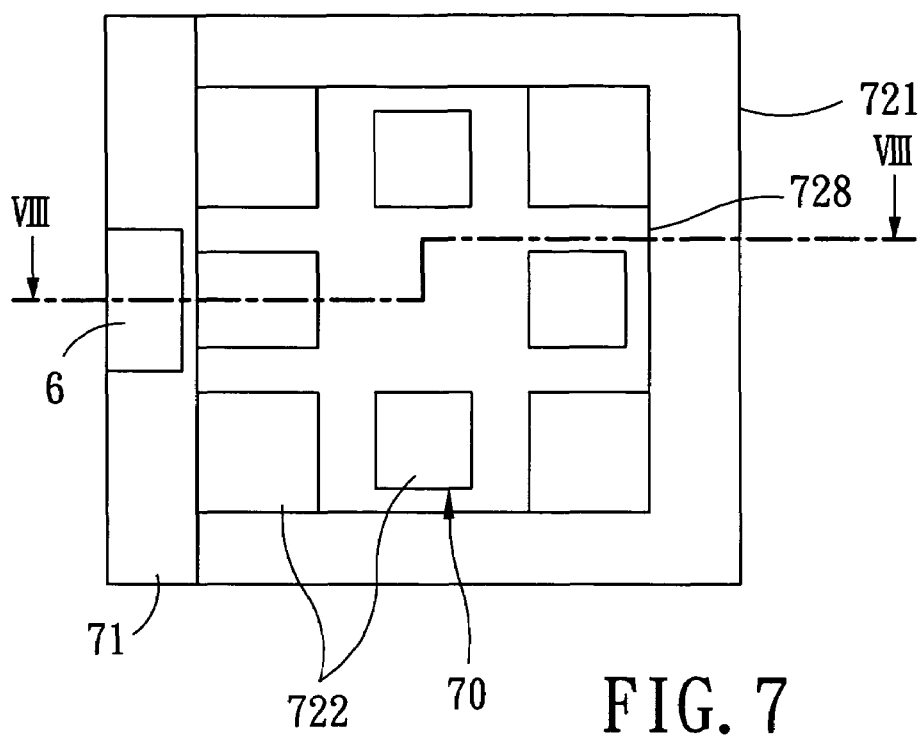
FIG. 7 is a schematic top view to illustrate how a spacer unit and a sacrificial layer are formed on the back plate of the first embodiment according to the method of this invention.
Figure 8:
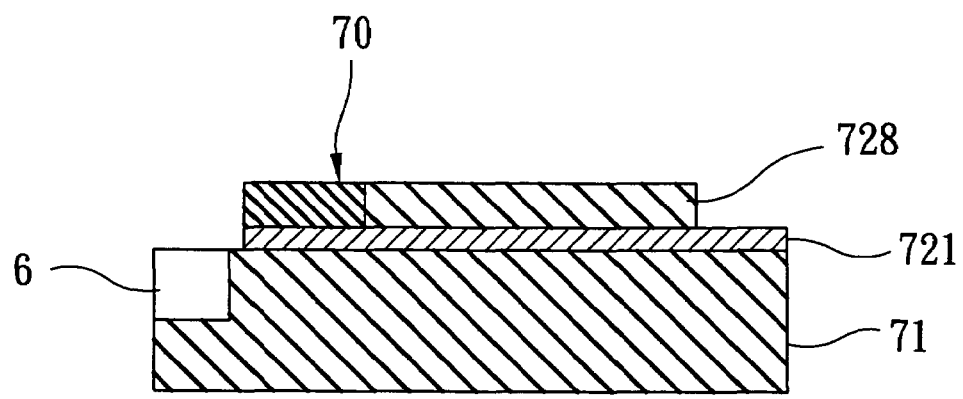
FIG. 8 is a schematic sectional view taken along lines VIII—VIII in FIG. 7.

FIGS. 2, 3A and 3B illustrate the first preferred embodiment of a condenser microphone 4 according to this invention for connecting electrically to a printed circuit board 400. The condenser microphone 4 includes: a condenser housing 5 defining an inner space 56 therein; and a variable gap condenser 7 enclosed in the inner space 56 in the condenser housing 5. The variable gap condenser 7 includes an insulating substrate 71, a conductive fixed back plate 721 mounted securely on the insulating substrate 71 and defining a first electrode of the variable gap condenser 7, a diaphragm unit 72 spaced apart from the back plate 721 and aligned with and movable relative to the back plate 721 in a first transverse direction relative to the back plate 721, and a spacer unit 70 interposed between and in contact with the back plate 721 and the diaphragm unit 72 so as to support the diaphragm unit 72 on the back plate 721 and so as to define a variable gap 725 thereamong. The spacer unit 70 includes a plurality of spaced apart spacer blocks 722 around the variable gap 725, and defines a plurality of air passage 726, each of which is defined by two adjacent ones of the spacer blocks 722, each of which extends in a second transverse direction relative to the first transverse direction, and each of which is disposed between and in spatial communication with the inner space 56 and the variable gap 725.

In this embodiment, the diaphragm unit 72 has a central portion 720 confining a top side of the variable gap 725, and a plurality of fins 727 disposed around and extending outwardly from a periphery of the central portion 720 and connected respectively to the spacer blocks 722. The diaphragm unit 72 defines a plurality of second air passages 729 (see FIG. 3B), each of which is defined by two adjacent ones of the fins 727 and each of which is in spatial communication with the inner space 56 and the variable gap 725. The presence of the fins 727 of the diaphragm unit 72 not only improves spatial communication between the inner space 56 and the variable gap 725, but also enhances the compliance of the diaphragm unit 72 and reduces the stress levels in the diaphragm unit 72. The diaphragm unit 72 includes a compliant layer 724 formed on the spacer unit 70, and a conductive film 723 formed on the compliant layer 724 and defining a second electrode of the variable gap condenser 7.

The condenser housing 5 has a bottom wall 52, a peripheral wall 53 extending upwardly from the bottom wall 52 and spaced apart from the variable gap condenser 7, and a top wall 51 opposite to the bottom wall 52 and extending laterally from the peripheral wall 53. The insulating substrate 71 is mounted on the bottom wall 52 of the condenser housing 5. The top wall 51 is spaced apart from the diaphragm unit 72, and is formed with a top opening 510 that is aligned with the diaphragm unit 72. The condenser housing 5 further has a cover 54 that covers the top opening 510 in the top wall 51 and that permits transmission of sound waves therethrough. The bottom wall 52 of the condenser housing 5 is formed with a plurality of conductive contacts 55 for establishing electrical connection between the variable gap condenser 7 and the printed circuit board 400 through surface mount techniques (SMT).

The insulating substrate 71 is preferably made from a silicon material. The conductive back plate 721 and the conductive film 723 are preferably made from a metal material. The spacer unit 70 and the compliant layer 724 of the diaphragm unit 72 are preferably made from a material selected from a group consisting of silicon, silicon dioxide, silicon nitride, and photoresists, such as polyimide resin, BCB resin, SINR resin, and SU-8 resin.

A field effect transistor 6 is mounted on the insulating substrate 71, and is connected electrically to the conductive film 723 so that a change in capacitance of the variable gap condenser 7 due to vibration of the diaphragm unit 72 by an incoming sound wave can be converted into a corresponding electrical signal.

Figure 9:
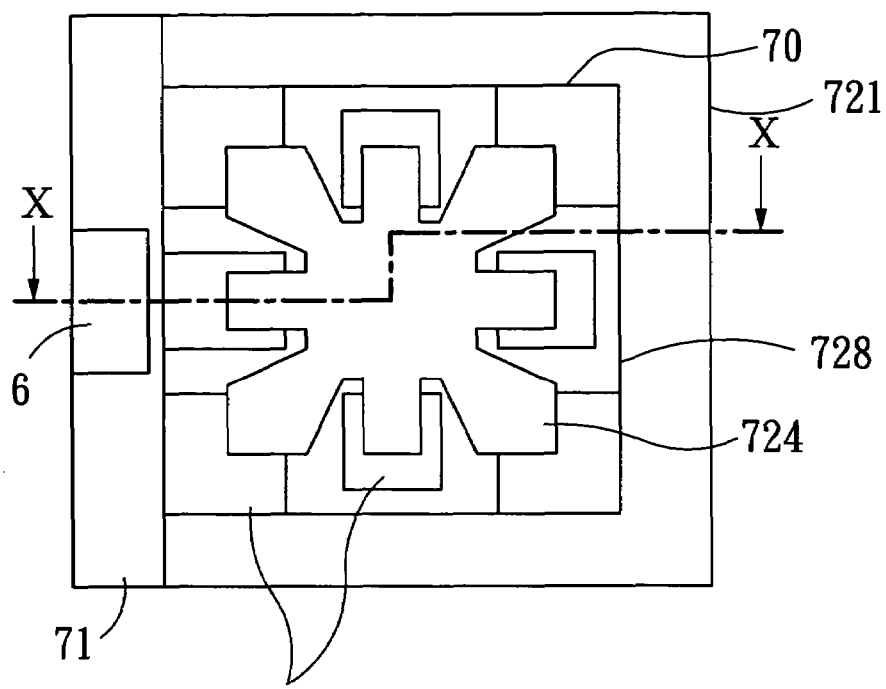
FIG. 9 is a schematic top view to illustrate how a compliant layer is formed on the spacer unit and the sacrificial layer of the first embodiment according to the method of this invention.
Figure 10:
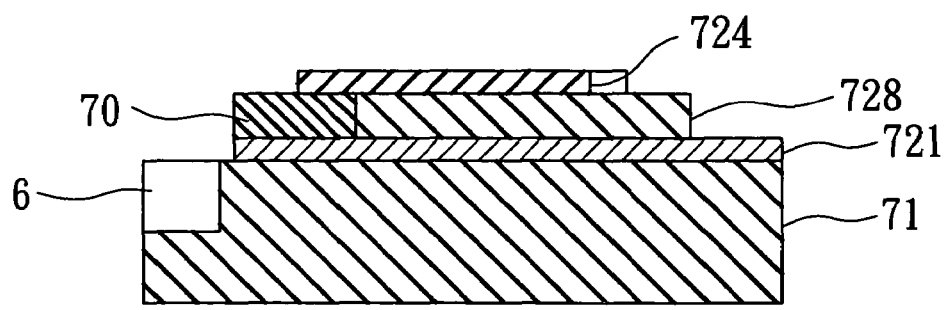
FIG. 10 is a schematic sectional view taken along lines X—X in FIG. 9.
Figure 11:
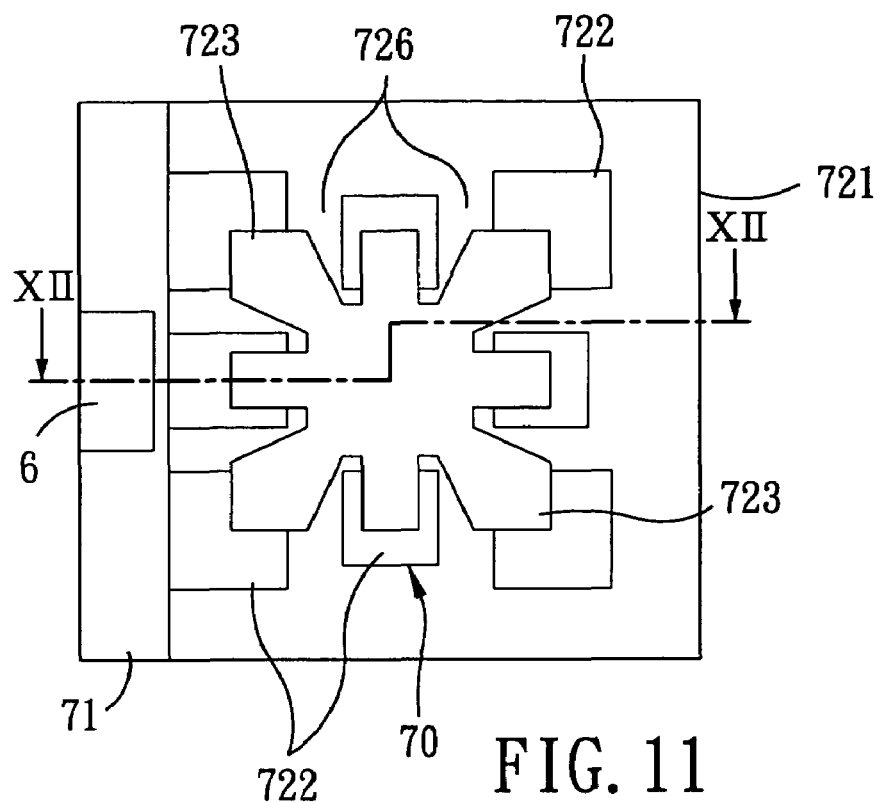
FIG. 11 is a schematic top view to illustrate how a conductive film is formed on the compliant layer of the first embodiment according to the method of this invention.
Figure 12:
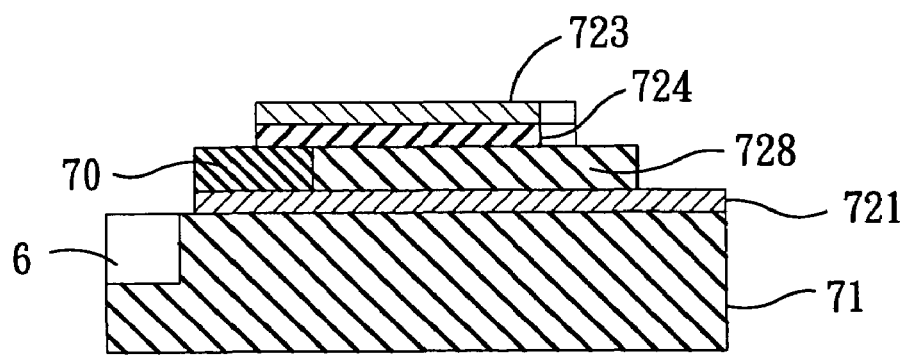
FIG. 12 is a schematic sectional view taken along lines XII—XII in FIG. 11.

FIGS. 4 to 12 illustrate consecutive steps of the method for making the condenser microphone 4 according to this invention. The method includes the steps of: (a) preparing the insulating substrate 71; (b) forming the field effect transistor 6 on the insulating substrate 71 through known semiconductor processing techniques (see FIG. 5); (c) forming the conductive back plate 721 on the insulating substrate 71 by deposition (see FIG. 6); (d) forming a spacer layer on the back plate 721 and patterning the spacer layer to form the spacer unit 70 and a sacrificial layer 728 on the back plate 721 using semiconductor processing techniques (see FIGS. 7 and 8); (e) forming the compliant layer 724 on the spacer unit 70 and the sacrificial layer 728 (FIGS. 9 and 10); (f) forming the conductive film 723 on the compliant layer 724 by deposition (FIGS. 11 and 12); (g) removing the sacrificial layer 728 from the back plate 721 by etching so as to form the air passages 726 (see FIGS. 2, 3A and 3B); and (h) mounting the assembly of the insulating substrate 71, the back plate 721, the spacer unit 70, and the diaphragm unit 72 in the condenser housing 5 (see FIGS. 2, 3A and 3B).

Figure 13:
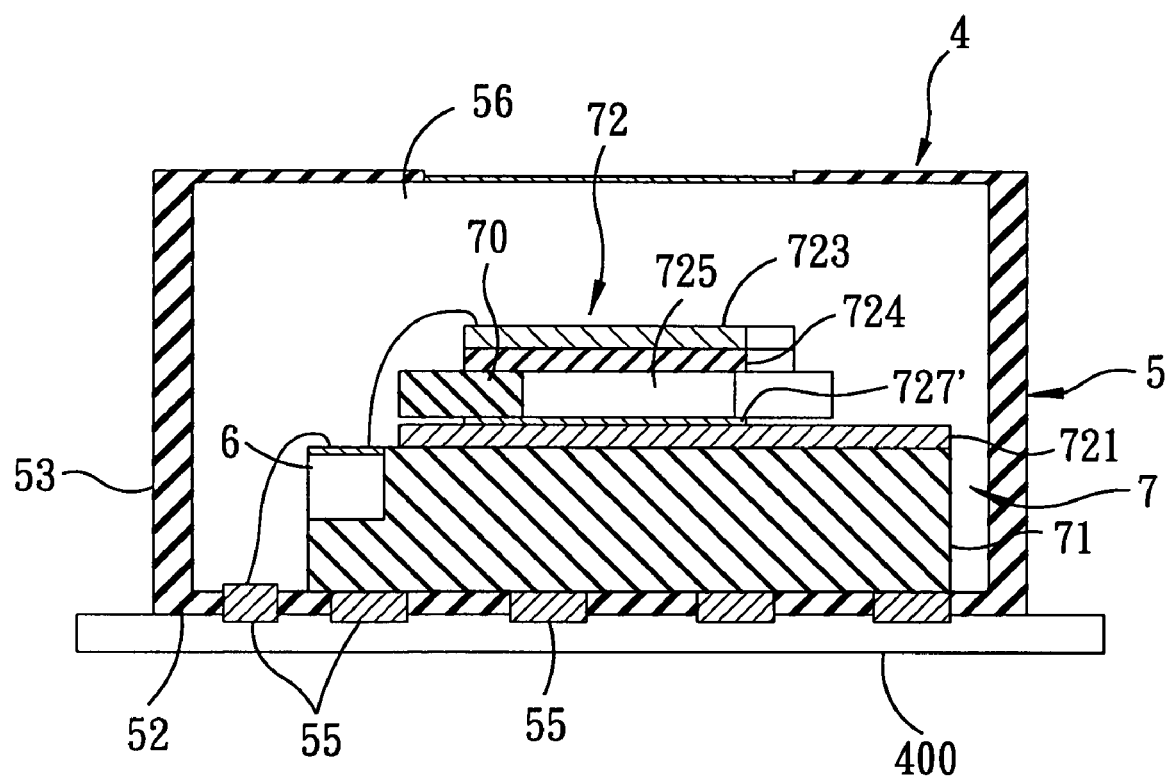
FIG. 13 is a schematic top view of the second preferred embodiment of the condenser microphone according to this invention.

FIG. 13 illustrates the second preferred embodiment of the condenser microphone 4 according to this invention. The condenser microphone 4 of this embodiment differs from the previous embodiment in that an electret 727' is provided in the variable gap condenser 7, is formed on the back plate 721, and is disposed between the back plate 721 and the spacer unit 70.

By forming the first air passages 726 in the spacer unit 70 and the second air passages 729 in the diaphragm unit 72, the aforesaid time-consuming drawback resulting from the formation of the buffering recess 311 in the insulating substrate 31 and the through-holes 321 in the back plate 32 of the conventional condenser microphone is eliminated.

With the invention thus explained, it is apparent that various modifications and variations can be made without departing from the spirit of the present invention. It is therefore intended that the invention be limited only as recited in the appended claims.

I claim:

1. A condenser microphone comprising:
   a condenser housing defining an inner space therein; and
   a variable gap condenser enclosed in said inner space in said condenser housing and including
      an insulating substrate,
      a conductive fixed back plate mounted securely on said insulating substrate,
      a diaphragm unit spaced apart from said back plate and aligned with and movable relative to said back plate in a first transverse direction relative to said back plate, and
      a spacer unit interposed between and in contact with said back plate and said diaphragm unit so as to support said diaphragm unit on said back plate and so as to define a variable gap thereamong, said spacer unit defining at least a first air passage that extends in a second transverse direction relative to said first transverse direction and that is disposed between and in spatial communication with said inner space and said variable gap;

wherein said spacer unit includes a plurality of spaced apart spacer blocks around said variable gap and defines a plurality of said first air passages, each of which is defined by two adjacent ones of said spacer blocks; and wherein said diaphragm unit has a central portion confining a top side of said variable gap, and a plurality of fins disposed around and extending outwardly from a periphery of said central portion and connected respectively to said spacer blocks, said diaphragm unit defining a plurality of second air passages, each of which is defined by two adjacent ones of said fins and each of which is in spatial communication with said inner space and said variable gap.

2. The condenser microphone of claim 1, wherein said diaphragm unit includes a compliant layer formed on said spacer unit, and a conductive film formed on said compliant layer and defining an electrode of said variable gap condenser.

3. The condenser microphone of claim 2, further comprising a field effect transistor mounted on said insulating substrate and connected electrically to said electrode.

4. The condenser microphone of claim 1, further comprising an electret formed on said back plate and disposed between said back plate and said spacer unit.

5. The condenser microphone of claim 1, wherein said condenser housing has a bottom wall, a peripheral wall extending upwardly from said bottom wall and spaced apart from said variable gap condenser, and a top wall opposite to said bottom wall and extending laterally from said peripheral wall, said insulating substrate being mounted on said bottom wall of said condenser housing, said top wall being spaced apart from said diaphragm unit and being formed with a top opening that is aligned with said diaphragm unit, said condenser housing further having a cover that covers said top opening in said top wall and that permits transmission of sound waves therethrough.

* * * * *